(12) United States Patent
Coumou et al.

(10) Patent No.: US 9,136,093 B2
(45) Date of Patent: Sep. 15, 2015

(54) SYNCHRONIZATION OF RF PULSING WITH RF METROLOGY, PROCESSING, AND CONTROL

(71) Applicant: MKS Instruments, Inc., Andover, MA (US)

(72) Inventors: David J. Coumou, Webster, NY (US); Larry J. Fisk, II, Fairport, NY (US); Aaron T. Radomski, Wyoming, NY (US); Jaehyun Kim, Daejeon (KR); Sang-Won Lee, Daejeon (KR); Jonathan Smyka, Rochester, NY (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 13/761,955

(22) Filed: Feb. 7, 2013

(65) Prior Publication Data

US 2014/0218076 A1    Aug. 7, 2014

(51) Int. Cl.
*H01J 37/32* (2006.01)

(52) U.S. Cl.
CPC ....... *H01J 37/32174* (2013.01); *H01J 37/3299* (2013.01)

(58) Field of Classification Search
CPC ....................................... H03L 7/099

USPC ............ 327/113, 115, 117; 331/34, 35, 36 L; 445/76, 255

See application file for complete search history.

(56) References Cited

U.S. PATENT DOCUMENTS

| 6,252,354 | B1 | 6/2001 | Collins et al. |
| 6,459,067 | B1 | 10/2002 | Vona, Jr. et al. |
| 7,839,223 | B2 | 11/2010 | Van Zyl et al. |
| 2006/0232471 | A1* | 10/2006 | Coumou ................. 342/450 |
| 2008/0085693 | A1* | 4/2008 | Harms .................... 455/255 |

FOREIGN PATENT DOCUMENTS

EP    0677221 A1    10/1995

* cited by examiner

*Primary Examiner* — John Poos
(74) *Attorney, Agent, or Firm* — Harness, Dickey & Pierce, P.L.C.

(57) ABSTRACT

A radio frequency (RF) system is disclosed. The RF system includes an RF sensor, an analog to digital converter (ADC) module, a processing module, and a synchronization module. The RF sensor measures a parameter of an RF output and generates an RF signal based on the parameter. The ADC module converts samples of the RF signal into digital values. The processing module generates processed values based on the digital values. The synchronization module outputs one of the processed values in response to a transition in the RF output.

37 Claims, 10 Drawing Sheets

SYNCHRONIZATION OF RF PULSING WITH RF METROLOGY, PROCESSING, AND CONTROL

FIELD

The present disclosure relates to plasma chambers and to radio frequency (RF) measurement systems and methods.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A radio frequency (RF) generator receives alternating current (AC) input power and generates an RF output. The RF output may be applied to, for example, a plasma electrode of a plasma chamber. Plasma chambers may be used in thin film manufacturing systems and other types of systems.

In some circumstances, a plasma chamber may include a plurality of plasma electrodes. For example only, more than one plasma electrode may be implemented where a surface area being treated is larger than an area that a single plasma electrode may be capable servicing.

Accordingly, multiple RF generators may be employed in some circumstances. Each of the RF generators generates an RF output and applies the RF output to one of the plasma electrodes. The RF generators may be electrically connected in an effort to generate identical RF outputs.

SUMMARY

In a first feature, a radio frequency (RF) system is disclosed. The RF system includes an RF sensor, an analog to digital converter (ADC) module, a processing module, and a synchronization module. The RF sensor measures a parameter of an RF output and generates an RF signal based on the parameter. The ADC module converts samples of the RF signal into digital values. The processing module generates processed values based on the digital values. The synchronization module outputs one of the processed values in response to a transition in the RF output.

In further features, the RF system further includes: a driver that generates the RF output; a power supply module that applies a rail voltage to the driver based on a rail voltage setpoint; a driver control module that drives the driver based on a driver control setpoint; and an output control module that, based on the one of the processed values, selectively adjusts at least one of the rail voltage setpoint and the driver control setpoint.

In yet further features, the ADC module samples the RF signal at a first predetermined frequency.

In still further features, the output control module selectively updates the rail voltage setpoint and the driver control setpoint at a second predetermined frequency. The second predetermined frequency is less than the first predetermined frequency.

In further features, the synchronization module outputs the one of the processed values in response to an increase in the RF signal that is greater than a predetermined value.

In yet further features, the synchronization module outputs the one of the processed values in response to a decrease in the RF signal that is greater than a predetermined value In still further features, the synchronization module outputs the one of the processed values in response to one of an increase and a decrease in the rail voltage that is greater than a predetermined value.

In further features, the synchronization module outputs the one of the processed values in response to one of an increase and a decrease in an output of the driver control module that is greater than a predetermined value.

In yet further features: the RF sensor further measures a second parameter of the RF output and generates a second RF signal based on the second parameter; the RF system further comprises a second ADC module that converts samples of the second RF signal into second digital values; the processing module generates second processed values based on the second digital values; the synchronization module outputs one of the second processed values in response to the transition in the RF output; and the output control module selectively adjusts at least one of the rail voltage setpoint and the driver control setpoint further based on the one of the second processed values.

In still further features, a plasma chamber system includes: the RF system; a filter that filters the RF output; and a plasma electrode that receives the filtered RF output.

In a second feature, a radio frequency (RF) control method is disclosed. The RF control method includes: measuring a parameter of an RF output using an RF sensor; generating an RF signal based on the parameter using the RF sensor; converting samples of the RF signal into digital values; generating processed values based on the digital values; and outputting one of the processed values in response to a transition in the RF output.

In yet further features, the RF control method further includes: generating the RF output using a driver; applying a rail voltage to the driver based on a rail voltage setpoint; driving the driver based on a driver control setpoint; and, based on the one of the processed values, selectively adjusting at least one of the rail voltage setpoint and the driver control setpoint.

In still further features, the RF control method further includes sampling the RF signal at a first predetermined frequency.

In further features, the RF control method further includes selectively updating the rail voltage setpoint and the driver control setpoint at a second predetermined frequency. The second predetermined frequency is less than the first predetermined frequency.

In yet further features, the RF control method further includes outputting the one of the processed values in response to an increase in the RF signal that is greater than a predetermined value.

In further features, the RF control method further includes outputting the one of the processed values in response to a decrease in the RF signal that is greater than a predetermined value.

In still further features, the RF control method further includes outputting the one of the processed values in response to one of an increase and a decrease in the rail voltage that is greater than a predetermined value.

In yet further features, the RF control method further includes outputting the one of the processed values in response to one of an increase and a decrease in an input to the driver that is greater than a predetermined value.

In further features, the RF control method further includes: measuring a second parameter of the RF output using the RF sensor; generating a second RF signal based on the second parameter using the RF sensor; converting samples of the second RF signal into second digital values; generating second processed values based on the second digital values; outputting one of the second processed values in response to the transition in the RF output; and selectively adjusting at least one of the rail voltage setpoint and the driver control setpoint further based on the one of the second processed values.

In a third feature, a radio frequency (RF) system is disclosed. An RF sensor measures a parameter of an RF output and generates an RF signal based on the parameter. An analog to digital converter (ADC) module that converts samples of the RF signal into digital values. A synchronization module outputs one of the digital values in response to a transition in the RF output. A processing module generates a processed value based on the one of the digital values.

In further features, the RF system further includes: a driver that generates the RF output; a power supply module that applies a rail voltage to the driver based on a rail voltage setpoint; a driver control module that drives the driver based on a driver control setpoint; and an output control module that, based on the processed value, selectively adjusts at least one of the rail voltage setpoint and the driver control setpoint.

In still further features, the ADC module samples the RF signal at a first predetermined frequency.

In yet further features, the output control module selectively updates the rail voltage setpoint and the driver control setpoint at a second predetermined frequency. The second predetermined frequency is less than the first predetermined frequency.

In further features, the synchronization module outputs the one of the digital values in response to an increase in the RF signal that is greater than a predetermined value.

In still further features, the synchronization module outputs the one of the digital values in response to a decrease in the RF signal that is greater than a predetermined value.

In yet further features, the synchronization module outputs the one of the digital values in response to one of an increase and a decrease in the rail voltage that is greater than a predetermined value.

In further features, the synchronization module outputs the one of the digital values in response to one of an increase and a decrease in an output of the driver control module that is greater than a predetermined value.

In still further features: the RF sensor further measures a second parameter of the RF output and generates a second RF signal based on the second parameter; the RF system further comprises a second ADC module that converts samples of the second RF signal into second digital values; the synchronization module outputs one of the second digital values in response to the transition in the RF output; the processing module generates a second processed value based on the one of the second digital values; and the output control module selectively adjusts at least one of the rail voltage setpoint and the driver control setpoint further based on the one of the second digital values.

In yet further features, a plasma chamber system includes: the RF system; a filter that filters the RF output; and a plasma electrode that receives the filtered RF output.

In a fourth feature, a radio frequency (RF) control method is disclosed. The RF control method includes: measuring a parameter of an RF output using an RF sensor; generating an RF signal based on the parameter using the RF sensor; converting samples of the RF signal into digital values; outputting one of the digital values in response to a transition in the RF output; and generating a processed value based on the one of the digital values.

In further features, the RF control method further includes generating an RF output using a driver; applying a rail voltage to the driver based on a rail voltage setpoint; driving the driver based on a driver control setpoint; and, based on the processed value, selectively adjusting at least one of the rail voltage setpoint and the driver control setpoint.

In yet further features, the RF control method further includes sampling the RF signal at a first predetermined frequency.

In still further features, the RF control method further includes selectively updating the rail voltage setpoint and the driver control setpoint at a second predetermined frequency. The second predetermined frequency is less than the first predetermined frequency.

In further features, the RF control method further includes outputting the one of the digital values in response to an increase in the RF signal that is greater than a predetermined value.

In yet further features, the RF control method further includes outputting the one of the digital values in response to a decrease in the RF signal that is greater than a predetermined value.

In still further features, the RF control method further includes outputting the one of the digital values in response to one of an increase and a decrease in the rail voltage that is greater than a predetermined value.

In further features, the RF control method further includes outputting the one of the digital values in response to one of an increase and a decrease in an input to the driver that is greater than a predetermined value.

In yet further features, the RF control method further includes: measuring a second parameter of the RF output using the RF sensor; generating a second RF signal based on the second parameter using the RF sensor; converting samples of the second RF signal into second digital values; outputting one of the second digital values in response to the transition in the RF output; generating a second processed value based on the one of the second digital values; and selectively adjusting at least one of the rail voltage setpoint and the driver control setpoint further based on the one of the second digital values.

In a fifth feature, a radio frequency (RF) system is disclosed. An RF sensor measures a parameter of an RF output and generates an RF signal based on the parameter. A sampling frequency module determines a sampling frequency based on a period between first and second transitions in the RF output. An analog to digital converter (ADC) module samples the RF signal based on the sampling frequency and converts the samples of the RF signal into digital values. A processing module generates processed values based on the digital values.

In further features, the RF system further includes: a driver that generates the RF output; a power supply module that applies a rail voltage to the driver based on a rail voltage setpoint; a driver control module that drives the driver based on a driver control setpoint; and an output control module that, based on the processed values, selectively adjusts at least one of the rail voltage setpoint and the driver control setpoint.

In still further features, the sampling frequency module detects a transition in the RF output when an increase in the RF signal is greater than a predetermined value.

In yet further features, the sampling frequency module detects a transition in the RF output when a decrease in the RF signal is greater than a predetermined value.

In further features, the sampling frequency module detects a transition in the RF output when one of an increase and a decrease in the rail voltage is greater than a predetermined value.

In still further features, the sampling frequency module detects a transition in the RF output when one of an increase and a decrease in an output of the driver control module is greater than a predetermined value.

In yet further features: the RF sensor further measures a second parameter of the RF output and generates a second RF signal based on the second parameter; the RF system further comprises a second ADC module that samples the second RF signal at the sampling frequency and that converts the samples of the second RF signal into second digital values; the processing module generates second processed values based on the second digital values; and the output control module selectively adjusts at least one of the rail voltage setpoint and the driver control setpoint further based on the one of the second processed values.

In further features, a plasma chamber system includes: the RF system; a filter that filters the RF output; and a plasma electrode that receives the filtered RF output.

In a sixth feature, a radio frequency (RF) control method is disclosed. The RF control method includes: measuring a parameter of an RF output using an RF sensor; generating an RF signal based on the parameter using the RF sensor; determining a sampling frequency based on a period between first and second transitions in the RF output; sampling the RF signal based on the sampling frequency; converting the samples of the RF signal into digital values; and generating processed values based on the digital values.

In further features, the RF control method further includes: generating the RF output using a driver; applying a rail voltage to the driver based on a rail voltage setpoint; driving the driver based on a driver control setpoint; and, based on the processed values, selectively adjusting at least one of the rail voltage setpoint and the driver control setpoint.

In yet further features, the RF control method further includes detecting a transition in the RF output when an increase in the RF signal is greater than a predetermined value.

In still further features, the RF control method further includes detecting a transition in the RF output when a decrease in the RF signal is greater than a predetermined value.

In further features, the RF control method further includes detecting a transition in the RF output when one of an increase and a decrease in the rail voltage is greater than a predetermined value.

In yet further features, the RF control method further includes detecting a transition in the RF output when one of an increase and a decrease in an input to the driver is greater than a predetermined value.

In still further features, the RF control method further includes: measuring a second parameter of the RF output using the RF sensor; generating a second RF signal based on the second parameter using the RF sensor; sampling the second RF signal at the sampling frequency; converting the samples of the second RF signal into second digital values; generating second processed values based on the second digital values; and selectively adjusting at least one of the rail voltage setpoint and the driver control setpoint further based on the one of the second processed values.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
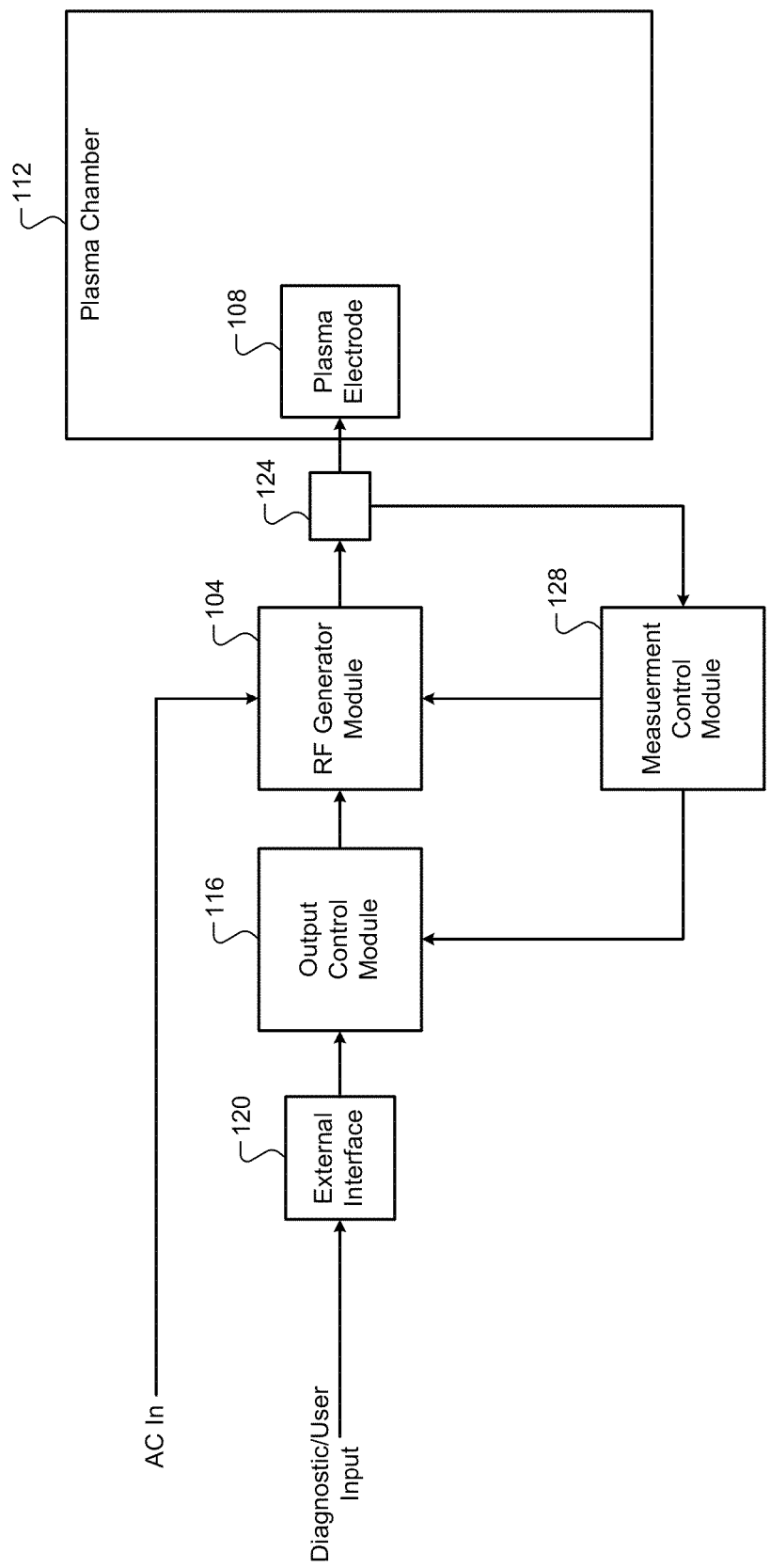
FIG. 1 is a functional block diagram of an example radio frequency (RF) plasma chamber system according to the present disclosure.

Referring now to FIG. 1, a functional block diagram of an example radio frequency (RF) plasma chamber system is presented. A radio frequency (RF) generator module 104 receives alternating current (AC) input power and generates an RF output using the AC input power. The RF output is applied to a plasma electrode 108 of a plasma chamber 112. In other types of systems, the RF output may be used differently. The plasma electrode 108 may be used, for example, in thin film deposition, thin film etching, and other types of systems.

An output control module 116 receives a power setpoint (P Set) for the RF output that is generated by the RF generator module 104 and that is delivered to the plasma electrode 108. The power setpoint may be provided, for example, via an external interface 120 or another suitable source. The external interface 120 may provide the power setpoint to the output control module 116, for example, based on a diagnostic or user input provided via a universal standard (US) 232 connection, via an Ethernet connection, via a wireless connection, or via a front panel interface.

An RF sensor 124 measures one or more parameters of the RF output and generates an RF signal based on the measured parameter(s). For example only, the RF sensor 124 may include a voltage-current (VI) sensor, an RF probe, a directional coupler, a gamma sensor, a phase-magnitude sensor, or another suitable type of RF sensor.

A measurement control module 128 samples the RF signal at a predetermined sampling frequency. The measurement control module 128 converts the (analog) samples into corresponding digital values. The measurement control module 128 also applies one or more signal processing functions to the digital values to produce processed values.

The output control module 116 controls magnitude, frequency, and phase of the RF output. The output control module 116 may selectively update one or more parameters used to control the RF output at a predetermined updating frequency. The predetermined updating frequency is less than the predetermined sampling frequency. In other words, the measurement control module 128 may sample the RF signal on multiple occasions between consecutive times when the output control module 116 may update one or more parameters used to control the RF output.

The output control module 116 may selectively update one or more of the parameters, for example, based on the processed values from the measurement control module 128. However, a delay associated with the sampling frequency of the measurement control module 128 and the signal processing function(s) performed to generate the processed values may cause the processed values to be non-time aligned with the updating.

Figure 2:
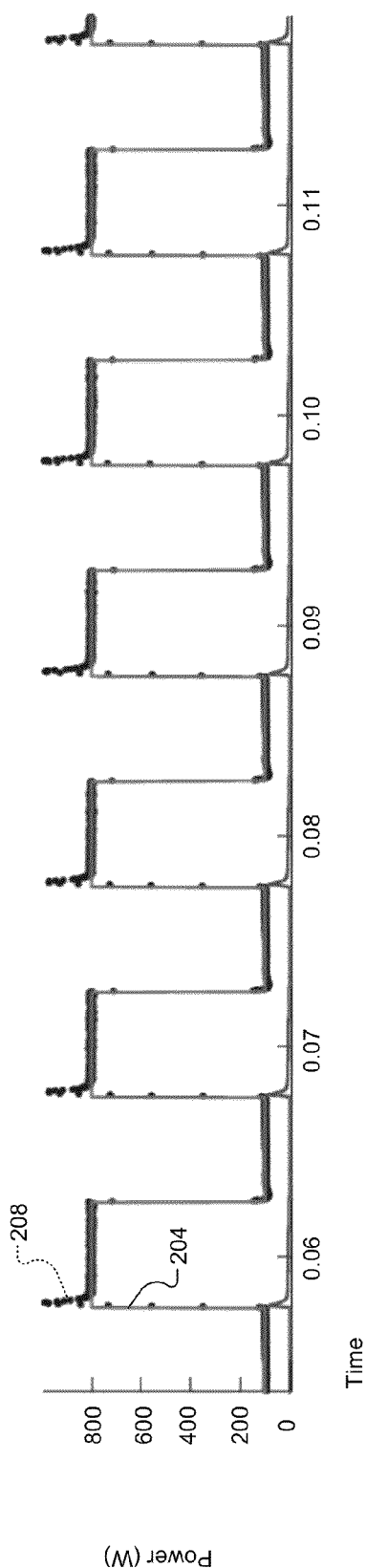
FIG. 2 is an example graph of output power of an RF generator versus time.

The non-alignment in time of the processed values with the updating may cause the output control module 116 to incorrectly adjust one or more of the parameters used to control the RF output. For example, FIG. 2 is a graph of power versus time for a system where the processed values are non-aligned in time with the updating performed by the output control module 116. Solid trace 204 tracks a target power of the RF output, and dotted trace 208 tracks the actual power of the RF output. As illustrated in FIG. 2, the output control module 116 may cause the RF output to overshoot a target based on the non-alignment of the processed values with the updating. While the example of overshoot is provided, other output controllers may undershoot or both under and overshoot a target based on the non-alignment of the processed values.

Referring back to FIG. 1, the measurement control module 128 therefore provides the processed values to the output control module 116 each time that a transition in the RF output is detected. The transition may be an increase or a decrease in the RF output. In this manner, the provision of the processed values is synchronized in time with the transitions in the RF output. Based on these processed values that are time-aligned with the transitions in the RF output and based on the setpoint values that resulted in those processed values, the output control module 116 may more accurately control the RF output.

Figure 3:
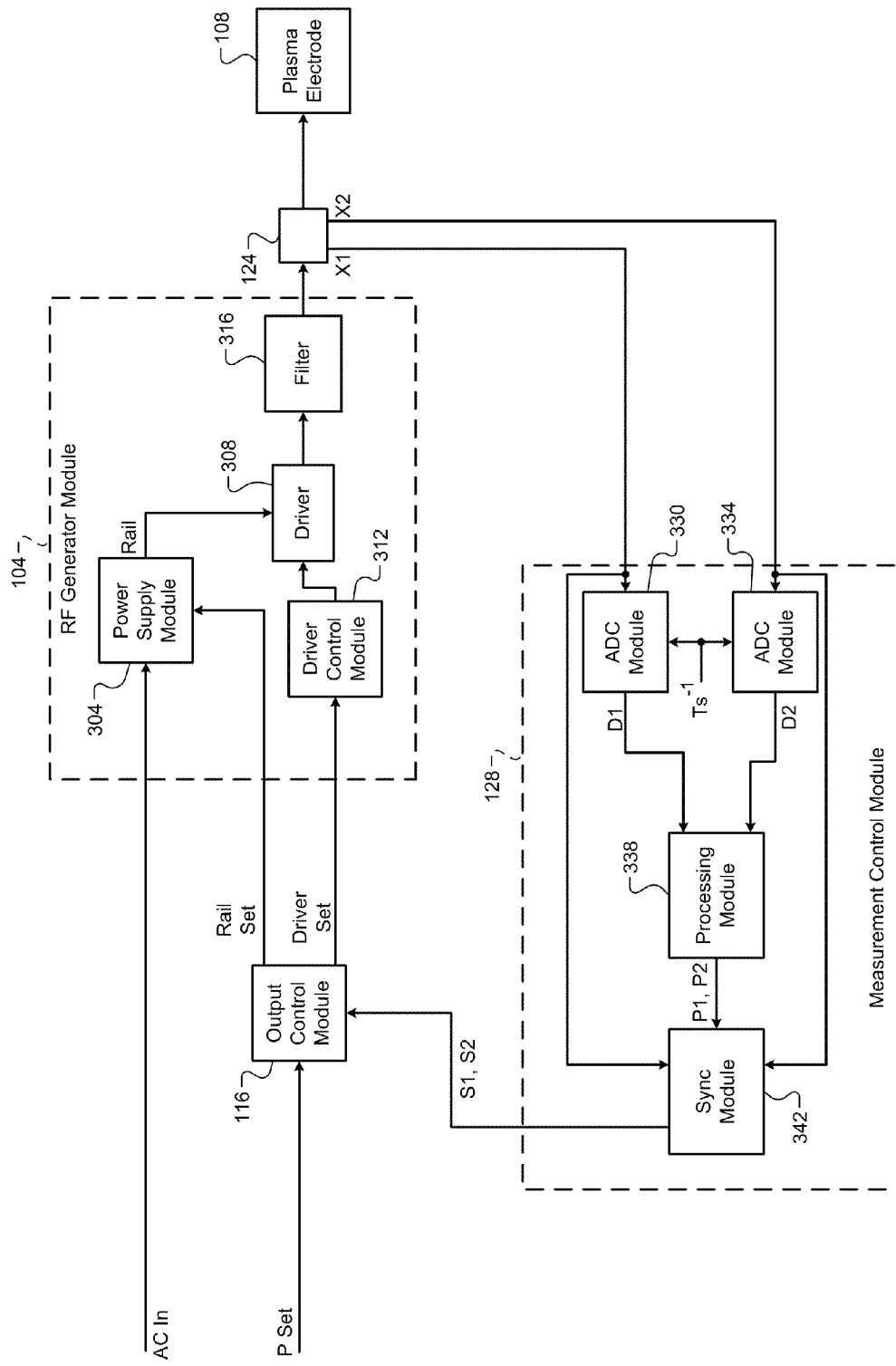
FIG. 3 is a functional block diagram of an example portion of the RF plasma chamber system according to the present disclosure.

Referring now to FIG. 3, a functional block diagram including an example portion of the RF plasma chamber system is presented. The output control module 116 may generate a rail voltage setpoint (Rail Set) and a driver control setpoint (Driver Set) based on the power setpoint. Based on the rail voltage setpoint, a power supply module 304 generates a rail voltage from the AC input power. The power supply module 304 applies the rail voltage to a driver 308.

A driver control module 312 drives the driver 308 based on the driver control setpoint. The driver control setpoint may indicate a target duty cycle (i.e., a percentage of ON time for each predetermined period). The driver control module 312 may generate a pulse width modulation (PWM) signal having the target duty cycle and apply the PWM signal to the driver 308. The driver 308 generates an RF output based on the PWM signal and the rail voltage. A filter 316 may be implemented to filter the output of the driver 308 before the RF output is applied to the plasma electrode 108.

First and second analog to digital converter (ADC) modules 330 and 334 receive first and second parameters (X1 and X2) of the RF output measured by the RF sensor 124. For example, the first and second parameters may be voltage and current or other suitable parameters measured by RF sensors. In various implementations, one parameter or more than two parameters may be measured.

The first and second ADC modules 330 and 334 sample the first and second parameters at a predetermined sampling frequency ($Ts^{-1}$) and digitize the samples to produce first and second digital values (D1 and D2). A processing module 338 performs one or more signal processing functions on the first and second digital values to produce first and second processed values (P1 and P2). The processing module 338 may, for example, apply one or more filters (e.g., a band pass filter) and/or perform one or more other suitable signal processing functions. A band pass filter may be applied, for example, to reject out of band measurements from the RF sensor 124.

A synchronization module 342 outputs the current processed values to the output control module 116 as synchronized values (S1 and S2) when a level transition in the RF output is detected. As the predetermined sampling frequency is faster than the frequency at which the output control module 116 transitions the level of the RF output, the processed values may be updated one or more times before a level transition is detected.

The level transition in the RF output may be an increase or a decrease in one or more parameters of the RF output. While the example of a two-level RF output is provided in the example of FIG. 2, the output control module 116 may modulate the RF output to three or more different levels in various implementations. The synchronization module 342 may detect a level transition, for example, when the first parameter and/or the second parameter measured by the RF sensor 124 increases or decreases. The synchronization module 342 may require that the increase or decrease be greater than a predetermined amount. In various implementations, the synchronization module 342 may detect a transition in the RF output based on another suitable indicator of a transition in the RF output, such as the output of the driver control module 312, the rail voltage, etc.

Figure 4:
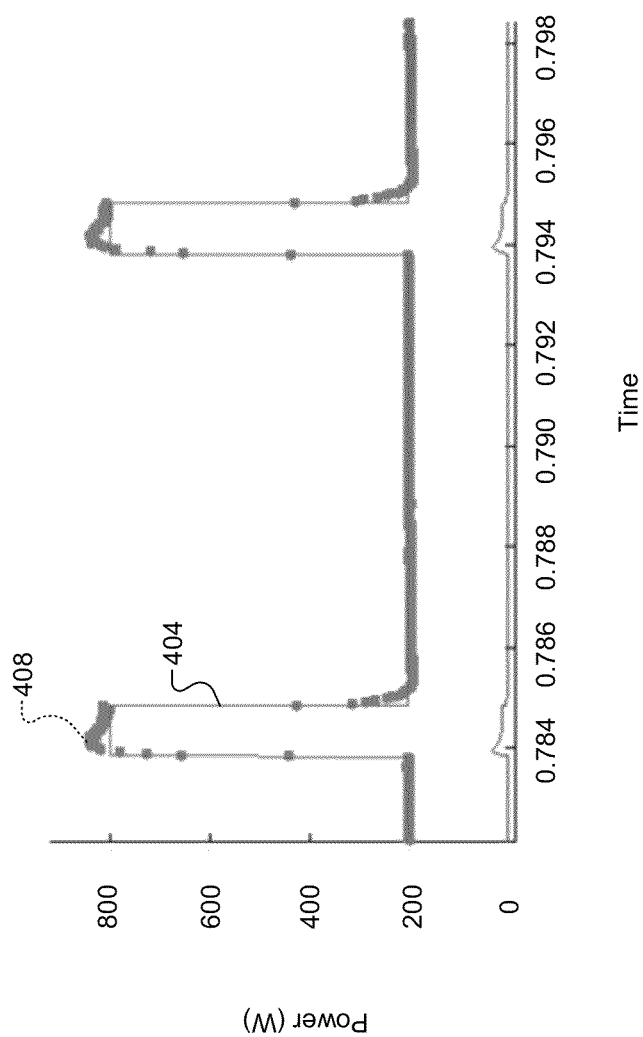
FIG. 4 is another example graph of output power of an RF generator versus time.

The output control module 116 may selectively adjust the rail voltage setpoint and/or the driver control setpoint based on the synchronized values. Based on these values, the output control module 116 may more accurately control the RF output. For example, FIG. 4 is an example graph of power versus time where the provision of the processed values is aligned with level transitions in the RF output. Solid trace 404 tracks a target power of the RF output, and dotted trace 408 tracks the actual power of RF output. Relative to the example graph of FIG. 2, it can be seen that use of the time aligned values may decrease overshoot. The coherent pulse generator can improve the repeatability of the pulse front because the measurement and control are synchronized with level transition.

Figure 5:
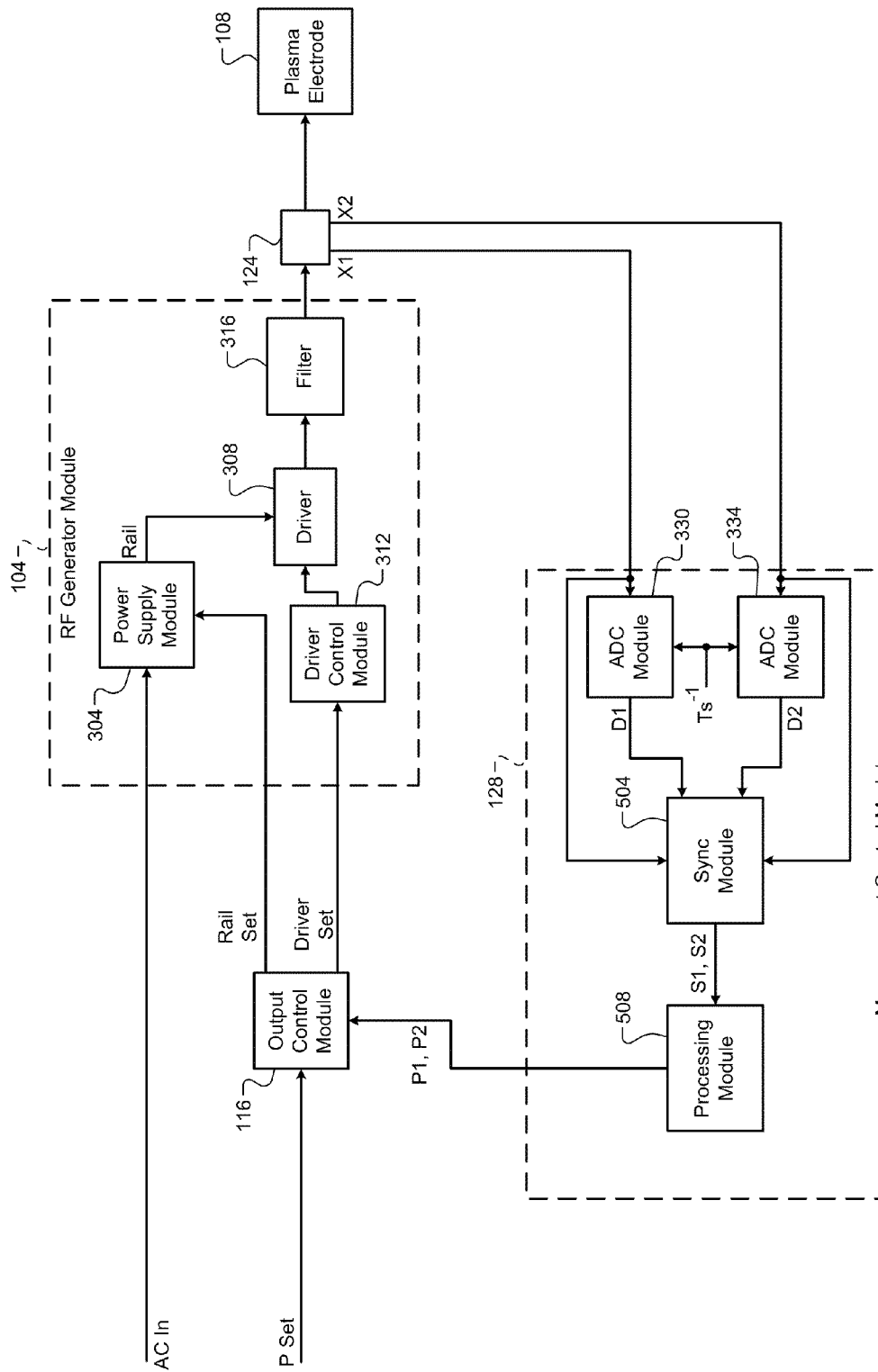
FIG. 5 is another functional block diagram of an example portion of the RF plasma generator system according to the present disclosure.

Referring now to FIG. 5, another functional block diagram including an example portion of the RF plasma chamber system is presented. Like the example of FIG. 3, the first and second ADC modules 330 and 334 sample the first and second parameters at the predetermined sampling frequency ($Ts^{-1}$) and digitize the samples to produce first and second digital values (D1 and D2).

A synchronization module 504 outputs the current digital values as synchronized values (S1 and S2) when a level transition in the RF output is detected. The synchronization module 504 may detect the occurrence of a level transition as discussed above.

A processing module 508 performs one or more signal processing functions on the first and second digital values to produce first and second processed values (P1 and P2). The processing module 508 may, for example, apply one or more filters (e.g., a band pass filter) and/or perform one or more other suitable signal processing functions. The processing module 508 outputs the processed values to the output control module 116, and the output control module 116 may selectively adjust the rail voltage setpoint and/or the driver control setpoint based on the processed values.

Figure 6:
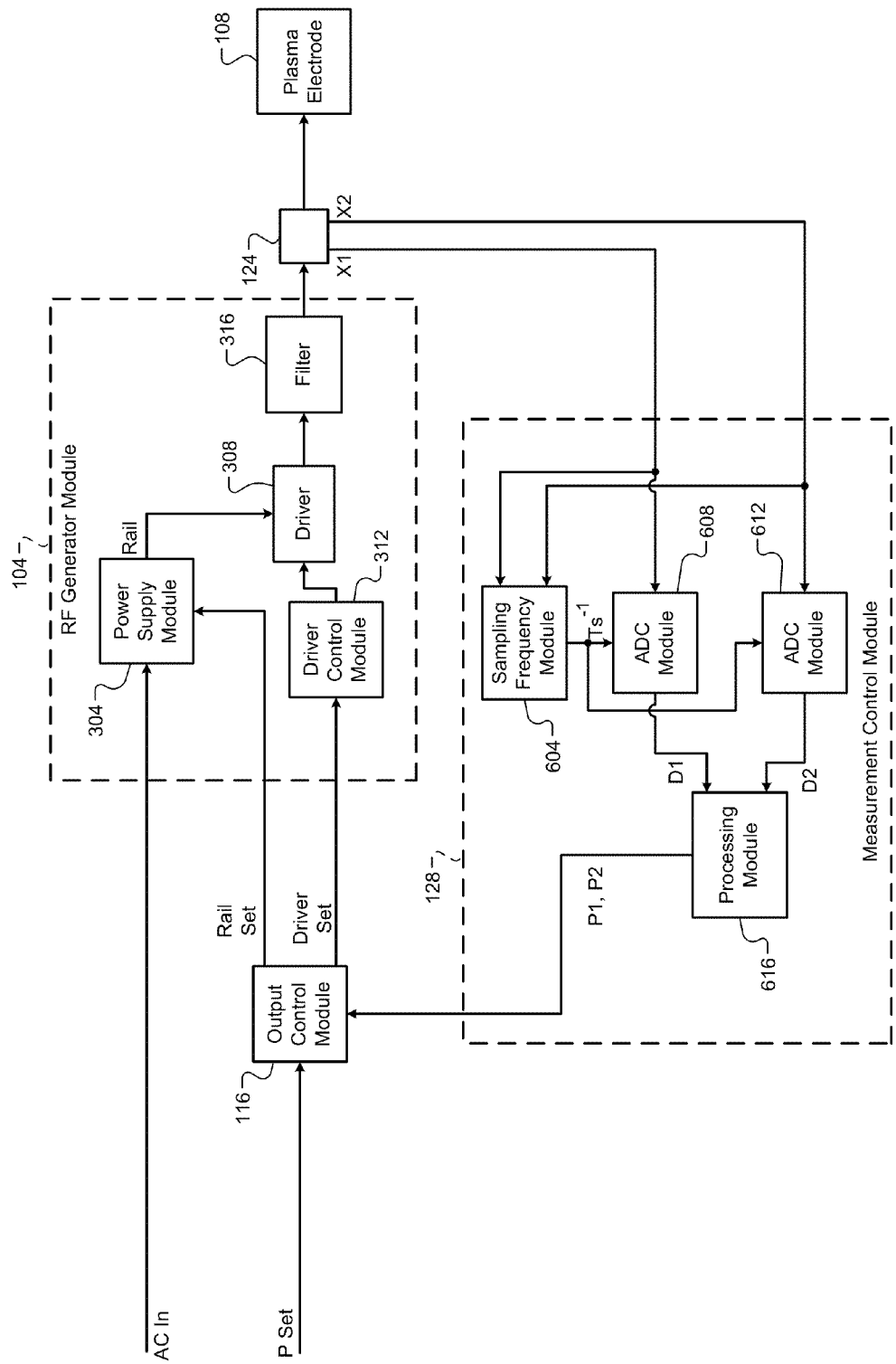
FIG. 6 is another functional block diagram of an example portion of the RF plasma generator system according to the present disclosure.

Referring now to FIG. 6, another functional block diagram including an example portion of the RF plasma chamber system is presented. A sampling frequency module 604 determines a sample frequency ($Ts^{-1}$) based on a period between level transitions in the RF output. The sampling frequency module 604 may detect transitions in the RF output, for example, when the first parameter and/or the second parameter measured by the RF sensor 124 increases or decreases. The sampling frequency module 604 may require that the increase or decrease be greater than a predetermined amount. In various implementations, the sampling frequency module 604 may detect a transition in the RF output based on another suitable indicator of a transition in the RF output, such as the output of the driver control module 312, the rail voltage, etc.

First and second ADC modules 608 and 612 receive the first and second parameters (X1 and X2) of the RF output measured by the RF sensor 124. The first and second ADC modules 608 and 612 sample the first and second parameters at the sampling frequency ($Ts^{-1}$) set by the sampling frequency module 604 and digitize the samples to produce first and second digital values (D1 and D2). As the sampling frequency module 604 sets the sampling frequency based on the period between level transitions, the first and second ADC modules 608 and 612 may produce the digital values approximately simultaneously with each level transition.

A processing module 616 performs one or more signal processing functions on the first and second digital values to produce first and second processed values (P1 and P2). The processing module 616 may, for example, apply one or more filters (e.g., a band pass filter) and/or perform one or more other suitable signal processing functions. The processing module 616 outputs the processed values to the output control module 116, and the output control module 116 may selectively adjust the rail voltage setpoint and/or the driver control setpoint based on the processed values.

While single-channel RF plasma chamber systems are shown and have been discussed, the present disclosure is also applicable to multi-channel RF generator systems. For example, a measurement control module that is similar or identical to the example measurement control module 128 of FIG. 3, 5, or 6 may be provided for each channel of a multi-channel RF generator. Additionally, while the present disclosure is discussed in the context of RF generator systems, the present disclosure is applicable to other types of systems that measure an RF output and that selectively transition the level of the RF output based on the measurements, such as matching systems/networks.

Figure 7:
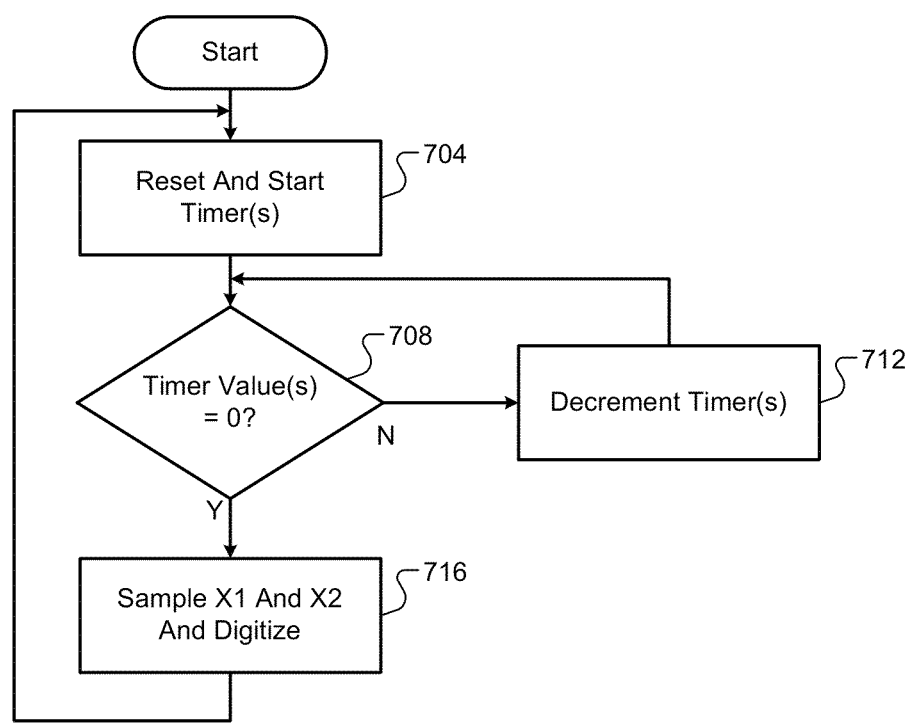
FIG. 7 is a flowchart depicting an example method of sampling and digitizing measurements of an RF sensor according to the present disclosure.

Referring now to FIG. 7, a flowchart depicting an example method of sampling and digitizing measurements of the RF sensor 124 is presented. Control may begin with 704 where the first and second ADC modules 330 and 334 reset and start first and second timers, respectively. The first and second ADC modules 330 and 334 reset the first and second timers to a predetermined period corresponding to the predetermined sampling frequency (i.e., 1/the predetermined sampling frequency). While two timers are discussed, one timer may be used in various implementations.

At 708, the first and second ADC modules 330 and 334 determine whether the values of the first and second timers are equal to zero. If 708 is false, the first and second ADC modules 330 and 334 decrement the first and second timers at 712, and control returns to 708. If 708 is true, control continues with 716. While resetting the timers based on the predetermined period, decrementing the timers, and comparing the timers with zero has been discussed, resetting to zero, incrementing, and determining whether the timers are greater than or equal to the predetermined period may be used.

At 716, the first and second ADC modules 330 and 334 sample the first and second parameters measured by the RF sensor 124 and digitize the samples to produce first and second digital values. The first and second ADC modules 330 and 334 hold the first and second digital values until a next time that first and second parameters are sampled and digitized. Control returns to 704 after 716.

Figure 8:
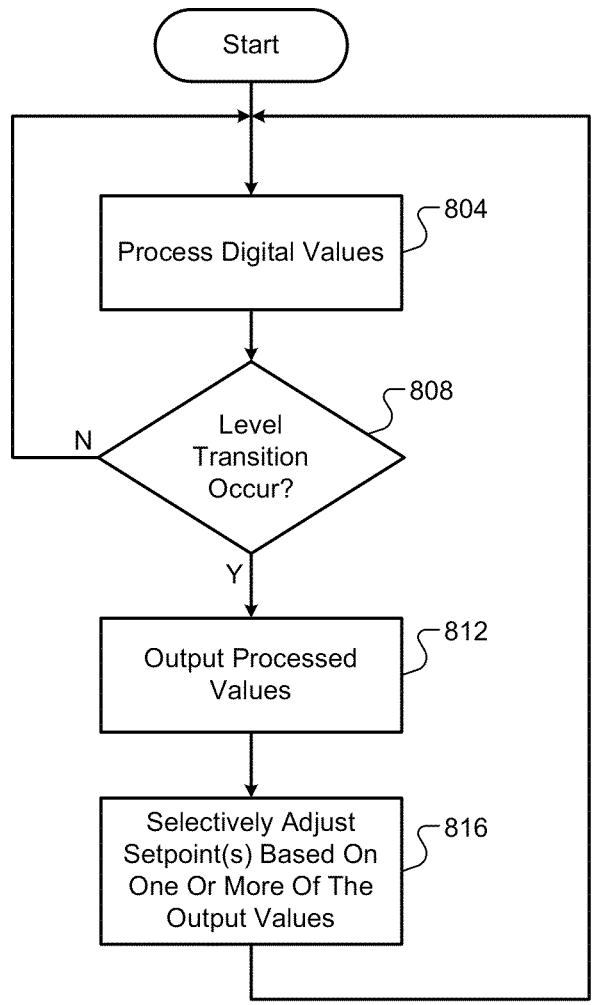
FIG. 8 is a flowchart depicting an example method of providing values of the measurements of an RF sensor corresponding to level transitions in an RF output and controlling the RF output based on the values according to the present disclosure.

Referring now to FIG. 8, a flowchart depicting an example method of providing values of the measurements of the RF sensor 124 corresponding to level transitions in the RF output and controlling the RF output based on the values is presented. The method may be performed, for example, by the measurement control module 128 of FIG. 3 and may be executed in parallel with the execution of the method of FIG. 7.

Control may begin with 804 where the processing module 338 processes the first and second digital values output by the first and second ADC modules 330 and 334 to produce the first and second processed values. At 808, the synchronization module 342 determines whether a transition in the level of the RF output has occurred. If 808 is false, control may return to 804. If 808 is true, control may continue with 812.

At 812, the synchronization module 342 outputs the first and second processed values as the first and second synchronized values. The output control module 116 may selectively adjust the rail voltage setpoint and/or the driver control setpoint at 816 based on the first and/or second synchronized values. Control may then return to 804.

Figure 9:
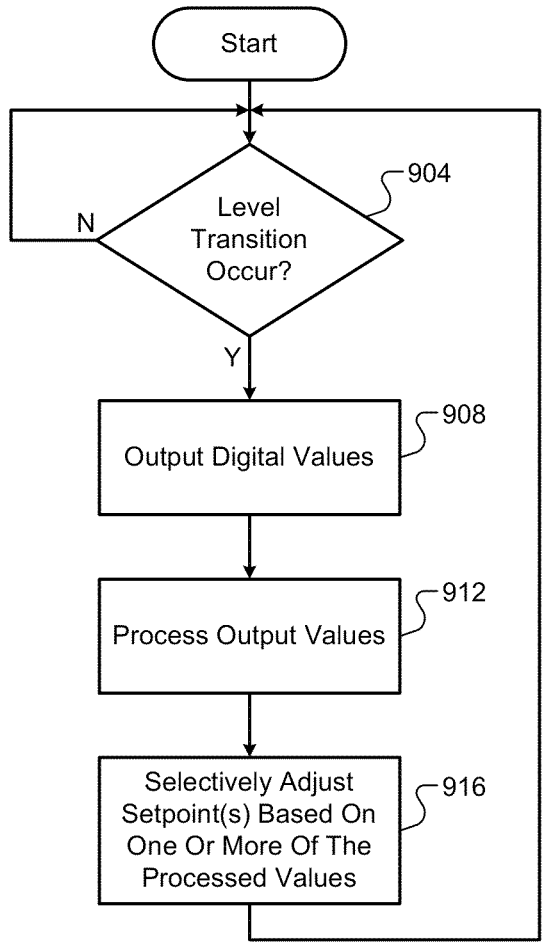
FIG. 9 is a flowchart depicting another example method of providing values of the measurements of an RF sensor corresponding to level transitions in an RF output and controlling the RF output based on the values according to the present disclosure.

Referring now to FIG. 9, a flowchart depicting another example method of providing values of the measurements of the RF sensor 124 corresponding to level transitions in the RF output and controlling the RF output based on the values is presented. The method may be performed, for example, by the measurement control module 128 of FIG. 5 and may be executed in parallel with the execution of the method of FIG. 7.

Control may begin with 904 where the synchronization module 504 determines whether a transition in the level of the RF output has occurred. If 904 is false, control may remain at 904. If 904 is true, control may continue with 908. At 908, the synchronization module 504 outputs the first and second digital values as the first and second synchronized values. The processing module 508 processes the first and second synchronized values at 912 to produce the first and second processed values. At 916, the output control module 116 may selectively adjust the rail voltage setpoint and/or the driver control setpoint at 816 based on the first and/or second processed values. Control may then return to 904.

Figure 10:
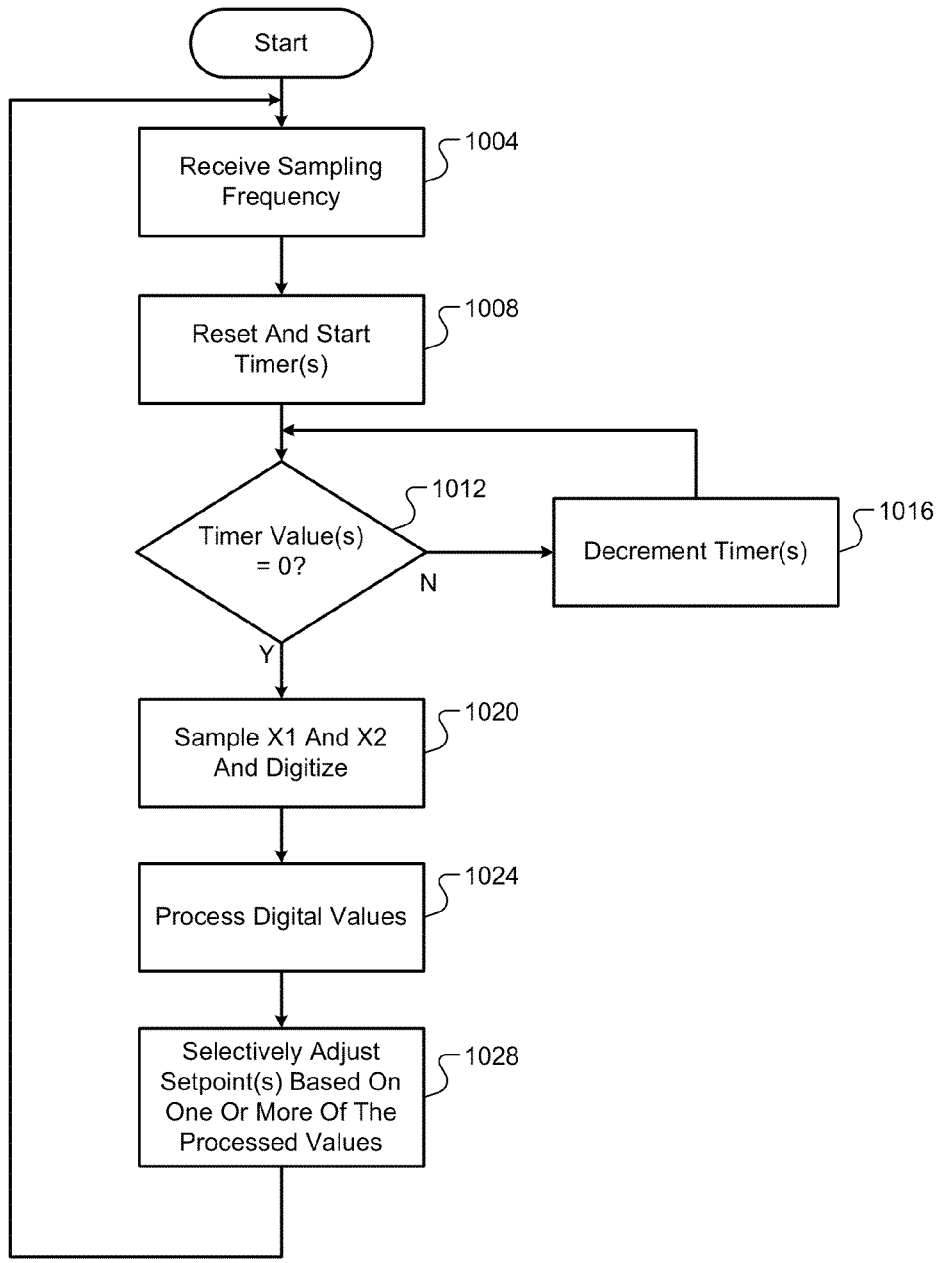
FIG. 10 is a flowchart depicting another example method of providing values of the measurements of an RF sensor corresponding to level transitions in an RF output and controlling the RF output based on the values according to the present disclosure.

Referring now to FIG. 10, a flowchart depicting another example method of providing values of the measurements of the RF sensor 124 corresponding to level transitions in the RF output and controlling the RF output based on the values is presented The method may be performed, for example, by the measurement control module 128 of FIG. 6.

Control may begin with 1004 where the first and second ADC modules 608 and 612 receive the sampling frequency. The sampling frequency module 604 determines the period between level transitions in the RF output and determines the sampling frequency based on the period between level transitions. The sampling frequency module 604 may determine and/or update the sampling frequency in parallel with the execution of the method of FIG. 10.

At 1008, the first and second ADC modules 608 and 612 reset and start first and second timers, respectively. The first and second ADC modules 608 and 612 reset the first and second timers to a period corresponding to the sampling frequency (i.e., 1/the sampling frequency). While two timers are discussed, one timer may be used in various implementations.

At 1012, the first and second ADC modules 608 and 612 determine whether the values of the first and second timers are equal to zero. If 1012 is false, the first and second ADC modules 608 and 612 decrement the first and second timers at 1016, and control returns to 1012. If 1012 is true, control continues with 1020. While resetting the timers based on the period, decrementing the timers, and comparing the timers with zero has been discussed, resetting to zero, incrementing, and determining whether the timers are greater than or equal to the period may be used.

At 1020, the first and second ADC modules 608 and 612 sample the first and second parameters measured by the RF sensor 124 and digitize the samples to produce first and second digital values. At 1024, the processing module 616 processes the first and second digital values to produce the first and second processed values. The output control module 116 may selectively adjust the rail voltage setpoint and/or the driver control setpoint at 1028 based on the first and/or second processed values. Control may then return to 1004.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A radio frequency (RF) system, comprising:
an analog to digital converter (ADC) module that converts samples of an RF signal into digital values, wherein the RF signal varies in accordance with an RF output;
a processing module that generates processed values based on the digital values; and
a synchronization module that synchronizes the output of one of the processed values with a transition in the RF output.

2. The RF system of claim 1 further comprising:
a driver that generates the RF output;
a power supply module that applies a rail voltage to the driver based on a rail voltage setpoint;
a driver control module that drives the driver based on a driver control setpoint; and
an output control module that, based on the one of the processed values, selectively adjusts at least one of the rail voltage setpoint and the driver control setpoint.

3. The RF system of claim 2 wherein the ADC module samples the RF signal at a first predetermined frequency.

4. The RF system of claim 3 wherein the output control module selectively updates the rail voltage setpoint and the driver control setpoint at a second predetermined frequency, wherein the second predetermined frequency is less than the first predetermined frequency.

5. The RF system of claim 2 wherein the synchronization module outputs the one of the processed values in response to one of an increase and a decrease in the RF output that is greater than a predetermined value.

6. A radio frequency (RF) control method, comprising:
generating an RF signal based on a parameter of a first RF output;
converting samples of the RF signal into digital values;
generating processed values based on the digital values; and
synchronizing the output of one of the processed values with a transition in a second RF output.

7. The RF control method of claim 6 further comprising:
generating the RF output using a driver;
applying a rail voltage to the driver based on a rail voltage setpoint;
driving the driver based on a driver control setpoint; and,
based on the one of the processed values, selectively adjusting at least one of the rail voltage setpoint and the driver control setpoint.

8. The RF control method of claim 7 further comprising sampling the RF signal at a first predetermined frequency.

9. The RF control method of claim 8 further comprising selectively updating the rail voltage setpoint and the driver control setpoint at a second predetermined frequency, wherein the second predetermined frequency is less than the first predetermined frequency.

10. The RF control method of claim 7 further comprising outputting the one of the processed values in response to one of an increase and a decrease in the second RF output that is greater than a predetermined value.

11. A radio frequency (RF) system, comprising:
an analog to digital converter (ADC) module that converts samples of an RF signal into digital values, wherein the RF signal varies in accordance with an RF output;
a synchronization module that synchronizes the output of one of the digital values with a transition in the RF output; and
a processing module that generates a processed value based on the one of the digital values.

12. The RF system of claim 11 further comprising:
a driver that generates the RF output;
a power supply module that applies a rail voltage to the driver based on a rail voltage setpoint;
a driver control module that drives the driver based on a driver control setpoint; and
an output control module that, based on the processed value, selectively adjusts at least one of the rail voltage setpoint and the driver control setpoint.

13. The RF system of claim 12 wherein the ADC module samples the RF signal at a first predetermined frequency.

14. The RF system of claim 13 wherein the output control module selectively updates the rail voltage setpoint and the driver control setpoint at a second predetermined frequency, wherein the second predetermined frequency is less than the first predetermined frequency.

15. The RF system of claim 12 wherein the synchronization module outputs the one of the digital values in response to one of an increase and a decrease in the RF signal that is greater than a predetermined value.

16. A radio frequency (RF) control method, comprising:
generating an RF signal based on a parameter of a RF output;
converting samples of the RF signal into digital values;
synchronizing the output of one of the digital values with a transition in the RF output; and
generating a processed value based on the one of the digital values.

17. The RF control method of claim 16 further comprising:
generating an RF output using a driver;
applying a rail voltage to the driver based on a rail voltage setpoint;
driving the driver based on a driver control setpoint; and,
based on the processed value, selectively adjusting at least one of the rail voltage setpoint and the driver control setpoint.

18. The RF control method of claim 17 further comprising sampling the RF signal at a first predetermined frequency.

19. The RF control method of claim 18 further comprising selectively updating the rail voltage setpoint and the driver control setpoint at a second predetermined frequency, wherein the second predetermined frequency is less than the first predetermined frequency.

20. The RF control method of claim 17 further comprising outputting the one of the digital values in response to one of an increase and a decrease in the RF signal that is greater than a predetermined value.

21. A radio frequency (RF) generator, comprising:
an analog to digital converter (ADC) module that converts samples of an RF signal into digital values, wherein the RF signal varies in accordance with a first RF output;
a processing module that generates processed values based on the digital values; and
a synchronization module that synchronizes the output of one of the processed values with a transition in a second RF output.

22. The RF generator of claim 21 wherein at least one of (a) the first RF output and the second RF output are the same outputs or (b) the first RF output and the second RF output are different outputs.

23. The RF generator of claim 22 further comprising:
a driver that generates the first RF output;
a power supply module that applies a rail voltage to the driver based on a rail voltage setpoint;
a driver control module that drives the driver based on a driver control setpoint; and
an output control module that, based on the one of the processed values, selectively adjusts at least one of the rail voltage setpoint and the driver control setpoint.

24. The RF generator of claim 23 wherein the ADC module samples the RF signal at a first predetermined frequency.

25. The RF generator of claim 24 wherein the output control module selectively updates the rail voltage setpoint and the driver control setpoint at a second predetermined frequency, wherein the second predetermined frequency is less than the first predetermined frequency.

26. The RF generator of claim 23 wherein the synchronization module outputs the one of the processed values in response to one of an increase and a decrease in the second RF output that is greater than a predetermined value.

27. The RF generator of claim 21 wherein at least one of (a) the first RF output and the second RF output are the same outputs or (b) the first RF output and the second RF output are different outputs.

28. A radio frequency (RF) system, comprising:
an analog to digital converter (ADC) module that converts samples of a first RF output into digital values;
a synchronization module that synchronizes the output of one of the digital values with a transition in a second RF output; and
a processing module that generates a processed value based on the one of the digital values.

29. The RF system of claim 28 wherein at least one of (a) the first RF output and the second RF output are the same outputs or (b) the first RF output and the second RF output are different outputs.

30. The RF system of claim 29 further comprising:
a driver that generates the one of the first or second RF outputs;
a power supply module that applies a rail voltage to the driver based on a rail voltage setpoint;
a driver control module that drives the driver based on a driver control setpoint; and
an output control module that, based on the processed value, selectively adjusts at least one of the rail voltage setpoint and the driver control setpoint.

31. The RF system of claim 30 wherein the ADC module samples the RF output at a first predetermined frequency.

32. The RF system of claim 31 wherein the output control module selectively updates the rail voltage setpoint and the driver control setpoint at a second predetermined frequency, wherein the second predetermined frequency is less than the first predetermined frequency.

33. The RF system of claim 29 wherein the synchronization module outputs the one of the digital values in response to one of an increase and a decrease in the second RF output that is greater than a predetermined value.

34. The RF system of claim 29 wherein at least one of (a) the first RF output and the second RF output are the same outputs or (b) the first RF output and the second RF output are different outputs.

35. The RF system of claim 1 further comprising an RF sensor that measures a parameter of the RF signal and that generates the RF signal based on the parameter.

36. The RF control method of claim 6 further comprising measuring the parameter of the first RF output using an RF sensor.

37. The RF system of claim 11 further comprising an RF sensor that measures a parameter of the RF signal and that generates the RF signal based on the parameter.

* * * * *